(12) United States Patent
Kilmer et al.

(10) Patent No.: US 10,032,505 B2
(45) Date of Patent: Jul. 24, 2018

(54) DYNAMIC RANDOM ACCESS MEMORY WITH PSEUDO DIFFERENTIAL SENSING

(71) Applicant: International Business Machines Corporation, Armonk, NY (US)

(72) Inventors: Charles A. Kilmer, Essex Junction, VT (US); Kyu-hyoun Kim, Chappaqua, NY (US); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/797,993

(22) Filed: Jul. 13, 2015

(65) Prior Publication Data
US 2017/0018301 A1   Jan. 19, 2017

(51) Int. Cl.
*G11C 11/24* (2006.01)
*G11C 11/4096* (2006.01)
*G11C 11/4091* (2006.01)
*G11C 7/06* (2006.01)
*G11C 11/404* (2006.01)
*G11C 11/4097* (2006.01)

(52) U.S. Cl.
CPC .......... *G11C 11/4096* (2013.01); *G11C 7/062* (2013.01); *G11C 11/404* (2013.01); *G11C 11/4091* (2013.01); *G11C 11/4097* (2013.01); *G11C 2207/002* (2013.01)

(58) Field of Classification Search
CPC .... G11C 11/4096; G11C 7/062; G11C 11/404
USPC ....................................... 365/149
See application file for complete search history.

(56) References Cited

U.S. PATENT DOCUMENTS

| 4,961,166 | A | | 10/1990 | Sato et al. |
| 5,367,481 | A | * | 11/1994 | Takase ................ G11C 11/4074 365/149 |
| 5,430,672 | A | | 7/1995 | Kuwabara et al. |
| 5,495,440 | A | | 2/1996 | Asakura |
| 5,610,868 | A | | 3/1997 | Inaba et al. |
| 5,638,322 | A | | 6/1997 | Lacey |
| 5,764,562 | A | * | 6/1998 | Hamamoto .......... G11C 11/404 365/149 |
| 5,780,335 | A | * | 7/1998 | Henkels ................ H01L 27/108 257/E27.084 |
| 6,377,084 | B1 | | 4/2002 | Forbes |
| 6,385,108 | B2 | | 5/2002 | Morzano |
| 6,519,174 | B2 | | 2/2003 | Kirihata et al. |

(Continued)

OTHER PUBLICATIONS

Poulton, John, An Embedded DRAM for CMOS ASICs, Proceedings of the 17th Conference on Advanced Research in VLSI, Sep. 15, 1997, pp. 288-302, IEEE Computer Society, Washington DC.

(Continued)

*Primary Examiner* — Anthan Tran
(74) *Attorney, Agent, or Firm* — Patterson + Sheridan, LLP

(57) ABSTRACT

Techniques are disclosed for dynamic random access memory (DRAM) cell. The DRAM cell comprises a first bit line and a first complementary bit line, a storage capacitor having a first node coupled with the first complementary bit line, and a transistor selectable by a word line to couple a second node of the storage capacitor to the first bit line, wherein a voltage potential across the first bit line and the first complementary bit line when the transistor is selected is indicative of a bit of data.

6 Claims, 9 Drawing Sheets

(56) References Cited

U.S. PATENT DOCUMENTS

| | | |
|---|---|---|
| 6,538,476 B2 | 3/2003 | Forbes |
| 6,633,503 B2 | 10/2003 | Morzano |
| 6,678,198 B2 | 1/2004 | Issa et al. |
| 6,829,180 B2 | 12/2004 | Shau |
| 6,853,591 B2 | 2/2005 | Schreck |
| 6,977,860 B1 | 12/2005 | Tooher et al. |
| 7,113,437 B2 | 9/2006 | Schweickert et al. |
| 7,235,835 B2 | 6/2007 | Nagano et al. |
| 7,352,619 B2 | 4/2008 | Ho |
| 7,368,950 B2 | 5/2008 | Wu et al. |
| 7,460,387 B2 | 12/2008 | Matick et al. |
| 7,613,057 B2 | 11/2009 | Lee |
| 7,816,717 B2 | 10/2010 | Ozaki |
| 7,821,858 B2 | 10/2010 | Matick et al. |
| RE42,659 E | 8/2011 | Takahashi et al. |
| 8,009,459 B2 | 8/2011 | Wu et al. |
| 2004/0151020 A1* | 8/2004 | Beer .................. G11C 11/405 365/149 |
| 2005/0045918 A1 | 3/2005 | Reith |
| 2005/0169090 A1 | 8/2005 | Shau |
| 2012/0036315 A1 | 2/2012 | Reohr et al. |

OTHER PUBLICATIONS

Nalam, Satyanand et al., Asymmetric 6T SRAM with Two-phase Write and Split Bitline Differential Sensing for Low Voltage Operation, Quality Electronic Design (ISQED), Mar. 2010, 8 pages, IEEE, Piscataway, United States.

U.S. Appl. No. 15/005,663, entitled Random Access Memory With Pseudo-Differential Sensing, filed Jan. 25, 2016.

IBM "List of IBM Patents or Patent Applications Treated as Related".

\* cited by examiner

US 10,032,505 B2

DYNAMIC RANDOM ACCESS MEMORY WITH PSEUDO DIFFERENTIAL SENSING

BACKGROUND

Embodiments presented herein generally relate to integrated circuit (IC) memory devices, and more specifically, to dynamic random access memory (DRAM) with pseudo differential sensing.

Dynamic random access memory (DRAM) is a type of random access memory which utilizes separate capacitors to store each bit of data in a circuit based upon whether the capacitor is charged or discharged. A memory circuit is formed from an array of these DRAM cells can have a single bit line serving all of the cells in a given column of the array. Similarly, a single word line may serve all the cells in a given row. In this manner, data stored in one of the DRAM cells in the memory circuit can be read from the cell's capacitor through its respective bit line in response to the word line activating the cell.

DRAM cells and circuits may be produced using semiconductor lithography. Modern trends in DRAM production including scaling DRAMs to ever smaller lithography sizes. As sizes are reduced, it becomes more difficult to maintain reliability and performance as lithography error rates increase. What is needed is are techniques for mitigating error rates without having negative impacts on DRAM array timings, refresh rates, and system performance.

SUMMARY

One embodiment presented herein describes a dynamic random access memory (DRAM) cell. The DRAM cell includes a first bit line and a first complementary bit line, a storage capacitor having a first node coupled with the first complementary bit line, and a transistor selectable by a word line to couple a second node of the storage capacitor to the first bit line, wherein a voltage potential across the first bit line and the first complementary bit line when the transistor is selected is indicative of a bit of data.

Other embodiments include, without limitation, a computer-readable medium that includes instructions that enable a processing unit to implement one or more aspects of the disclosed methods as well as a system having a processor, memory, and application programs configured to implement one or more aspects of the disclosed methods.

DETAILED DESCRIPTION

Embodiments presented herein describe techniques for dynamic random access memory (DRAM) with pseudo differential sensing. A DRAM cell may be coupled to a bit line and a complementary bit line driven to a low voltage state to allow for a larger charge to be stored in a storage capacitor of a DRAM cell during a memory write.

As lithography sizes are reduced, error rates in DRAM production increase. One technique for mitigating error rates includes increasing the amount of charge stored in a DRAM cell. As the value of a DRAM cell is based on whether the capacitor in the cell is charged or discharged, increasing the amount of charge stored in the DRAM cell allows the state of the capacitor to more easily sensed.

Figure 1:
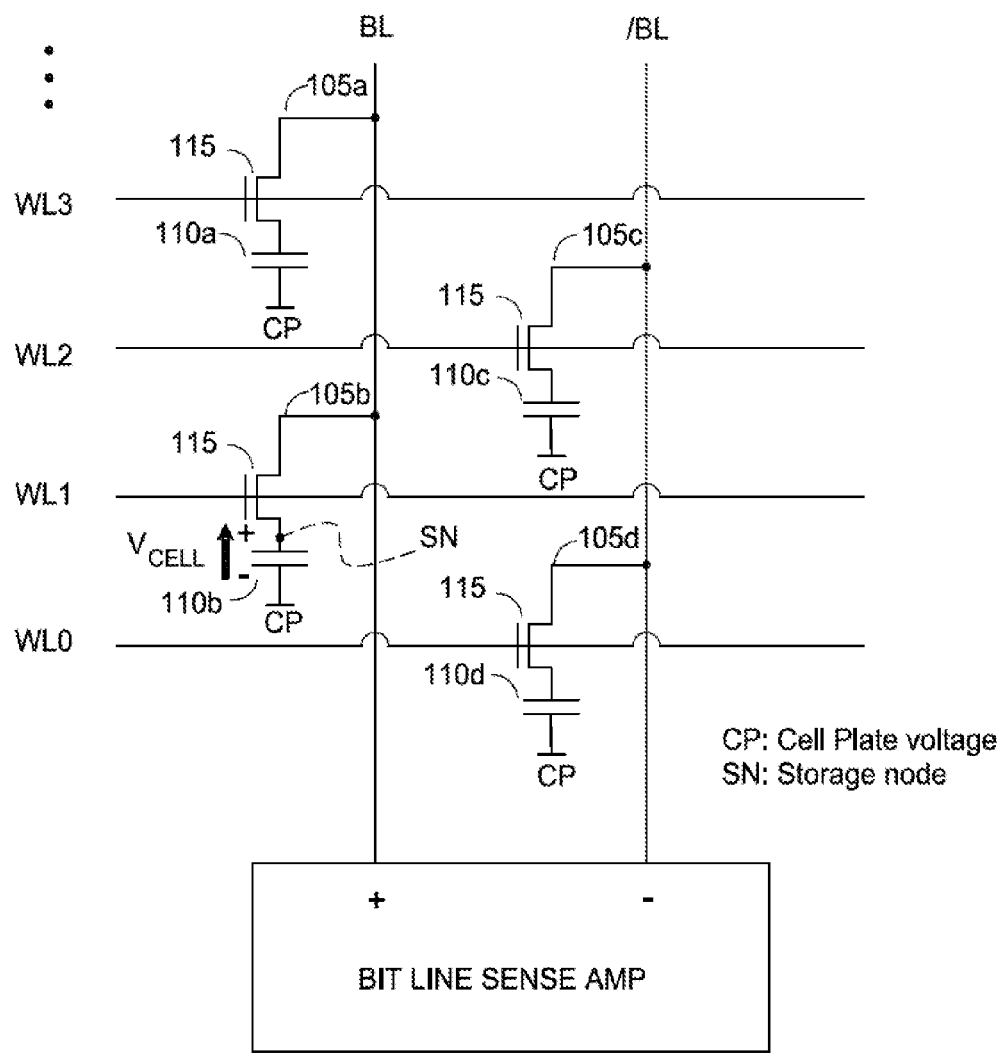
FIG. 1 is a schematic of an example memory circuit.

FIG. 1 is a schematic of a prior art memory circuit 100. Each DRAM cell 105a-105d is coupled to a bit line BL or a complementary bit line /BL, and a word line WL0-WL3 by access transistors 115. The bit line BL and complementary bit line /BL are also coupled to a bit line sense amplifier. The access transistor 115 is in turn coupled to a capacitor 110a-110d and a cell plate voltage CP. The storage node SN stores the capacitive charge representing the value stored in the DRAM cell.

Figure 2:
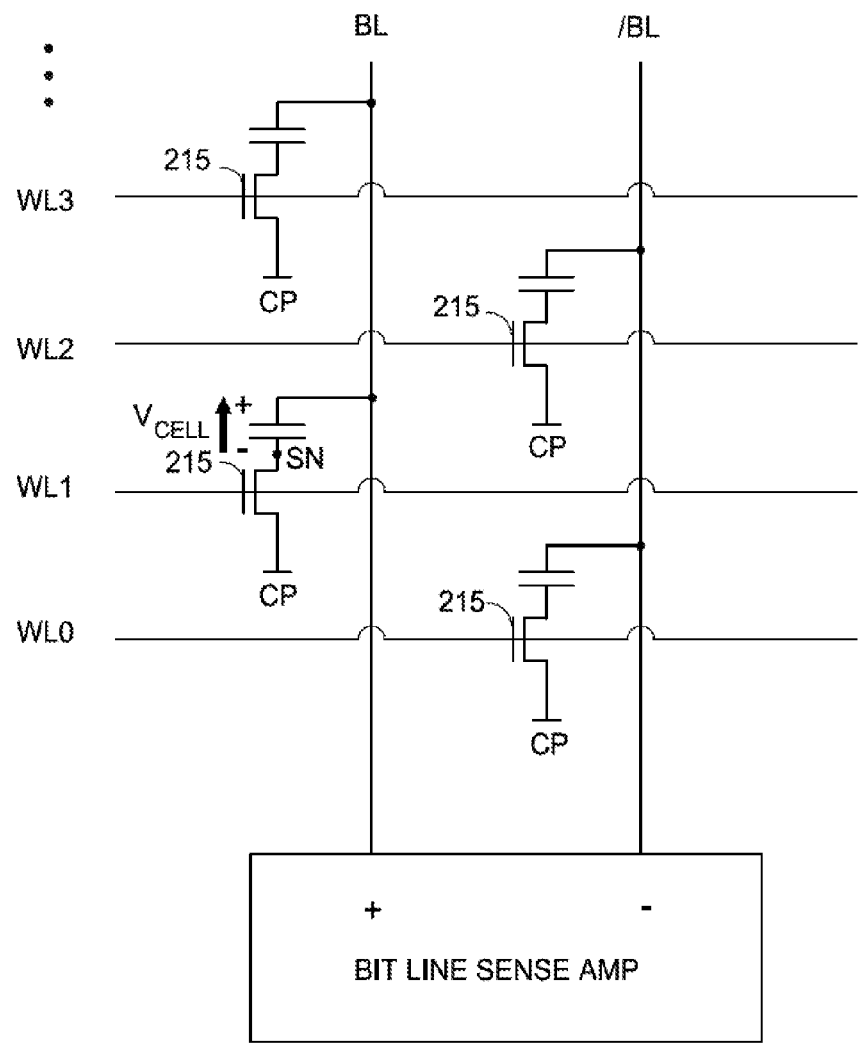
FIG. 2 is a schematic of another example memory circuit.

FIG. 2 is a schematic of an alternative prior art memory circuit 200. In memory circuit 200, the difference, relative to the memory circuit 100 of FIG. 1, is that bit line BL and complementary bit line /BL are coupled to the capacitors and the word lines WL0-WL3 by access transistors, which are in turn coupled to a cell plate voltage. Memory circuit 200 is operatively identical to memory circuit 100.

Figure 3:
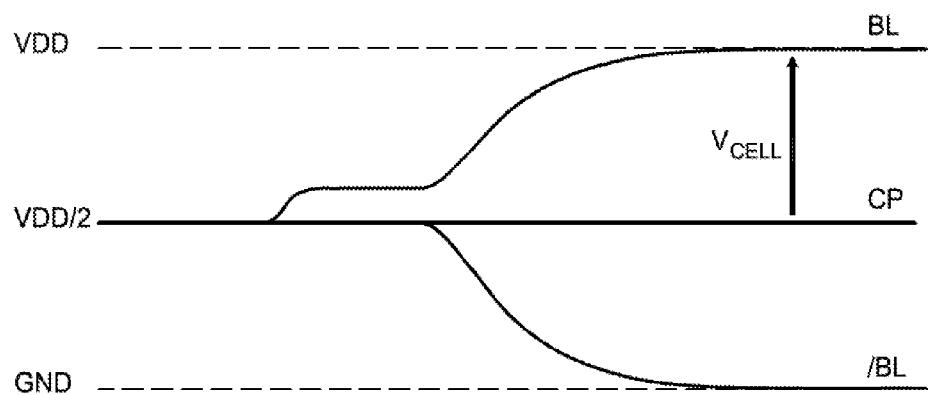
FIG. 3 shows a voltage diagram of the operation of a prior art DRAM cell.

FIG. 3 shows a voltage diagram of the operation of a prior art DRAM cell. When writing a value to a DRAM cell, a desired row write line is opened and the bit line sense amp corresponding to a desired column is forced to the desired high or low voltage state based on the value to be written. For example, here BL is charged to VDD, while the complementary bit line /BL is discharged to ground. Bit line BL then charges the cell storage capacitor to the desired value, here VDD. As the DRAM cell is connected to a cell plate voltage (CP) through the capacitor, the voltage potential of the cell (Vcell) is the difference between the charged voltage value (VDD) and CP or discharged voltage level (GND). Here, CP is the average of the charged and discharged voltage, or VDD/2.

A value of the DRAM cell may also be sensed by precharging the bit lines to CP. The desired row's word line is then opened, connecting the DRAM cell's storage capacitor with the bit line and transferring charge from the storage capacitor to the connected bit line where the storage capacitor is charged to a higher voltage. Where the storage capacitor is discharged, charge is transferred from the bit line to the storage capacitor. In either case, the voltage of the connected bit line changes, increasing or decreasing based on the charge previously stored in the storage capacitor. The complementary bit line retains the VDD/2 voltage as no write lines are opened in this case for the complementary bit line. The sense amplifier connected to the bit line pair may then amplify and sense the voltage difference between bit lines to determine whether the storage capacitor was discharged or charged based on the voltage difference of the bit lines.

Figure 4:
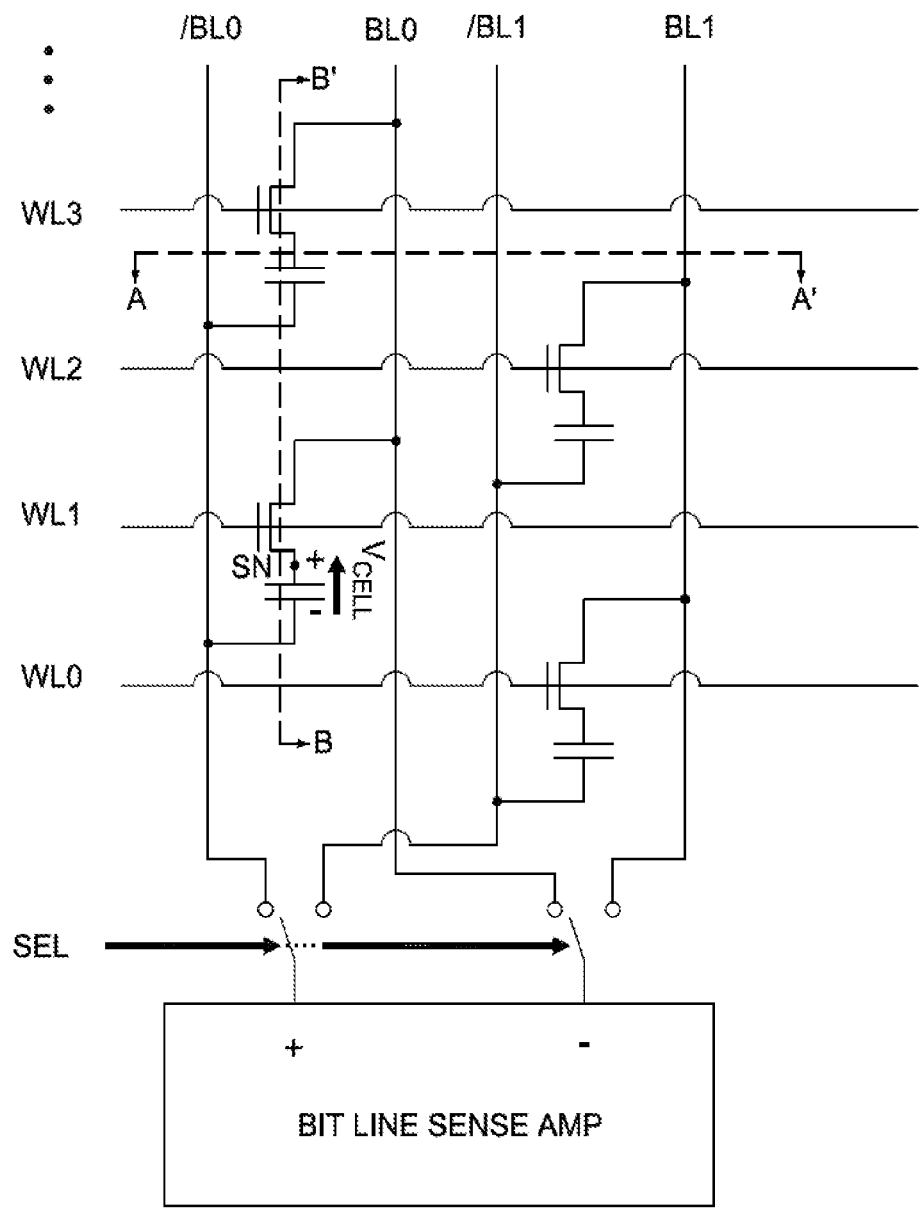
FIG. 4 is a schematic of DRAM with pseudo differential sensing, in accordance with certain aspects of the present disclosure.

FIG. 4 is a schematic of DRAM 400 with pseudo differential sensing, in accordance with certain aspects of the present disclosure. Each DRAM cell 405a-405d includes a capacitor 415 that is coupled to a first bit line BL0, BL1, a second, complementary bit line /BL0, /BL1, respectively, and a word line WL0-WL3 by an access transistor 415. The DRAM cell is then connected to a bit line as well as a complementary bit line, rather than being connected to a bit line and to CP or ground. The bit lines and complementary bit lines are also selectively coupled to a bit line sense amplifier by a selector SEL. The selector SEL couples the appropriate bit lines to the sense amplifier based on the bit lines to be sampled.

Figure 5:
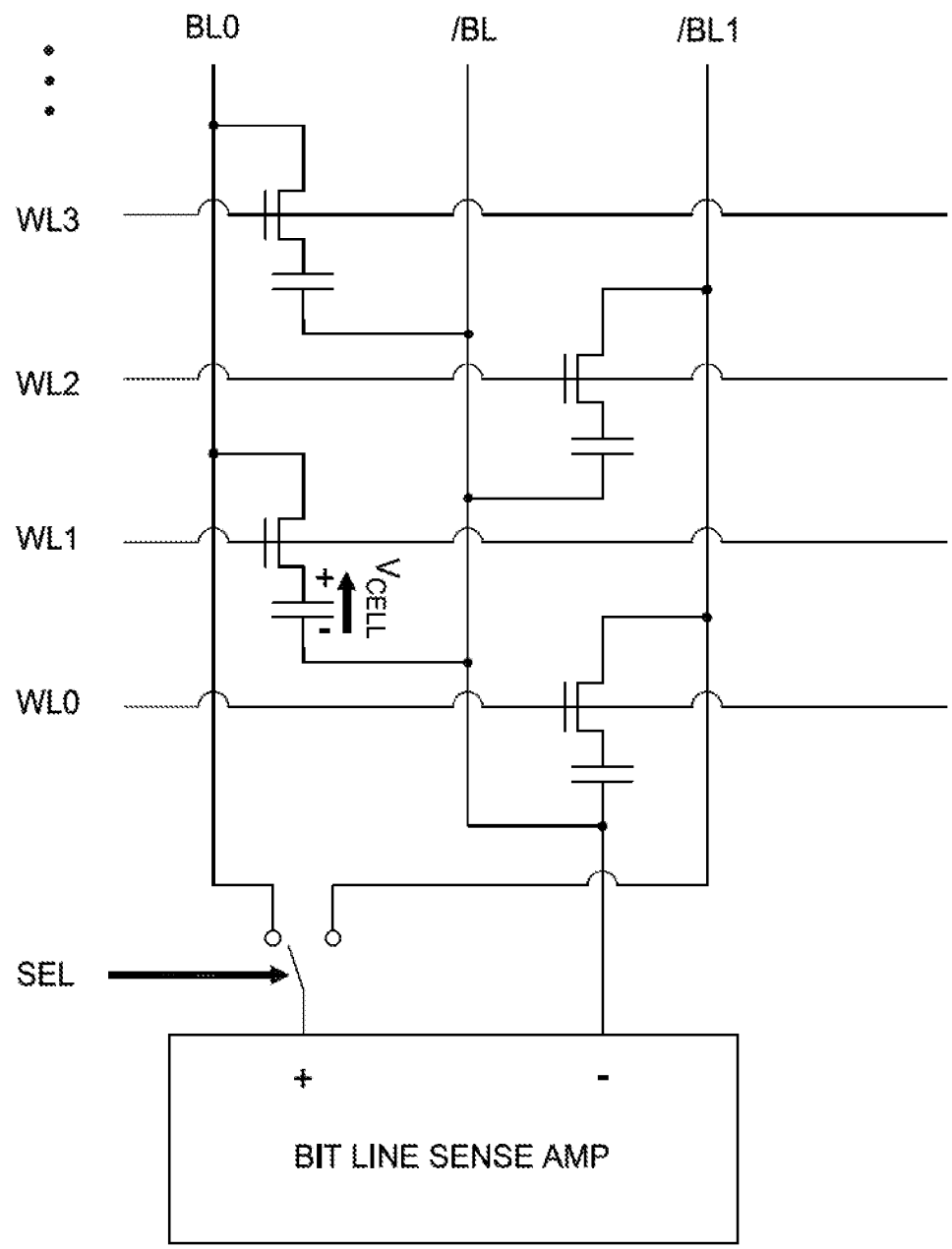
FIG. 5 is a schematic of another DRAM with pseudo differential sensing, in accordance with certain aspects of the present disclosure.

FIG. 5 is a schematic of another DRAM 500 with pseudo differential sensing, in accordance with certain aspects of the present disclosure. In FIG. 5 multiple bit lines BL0 and BL1 may be coupled to a single, shared complementary bit line /BL. The bit lines are selectively coupled to a bit line sense amplifier by a selector SEL and the selector SEL couples the appropriate bit lines to the sense amplifier based on the bit lines to be sampled.

Figure 6:
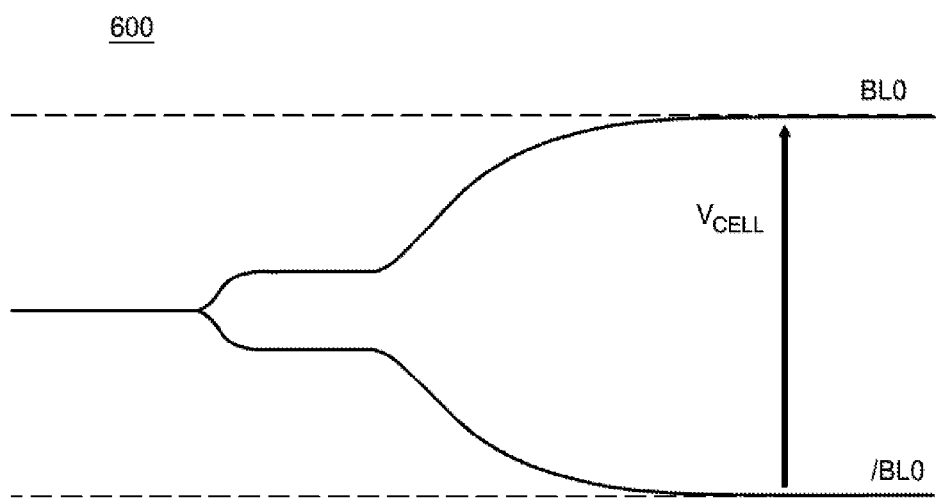
FIG. 6 shows a voltage diagram of DRAM with pseudo differential sensing, in accordance with certain aspects of the present disclosure.

FIG. 6 shows a voltage diagram 600 of the operation of a DRAM with pseudo differential sensing, in accordance with certain aspects of the present disclosure. This cell architecture allows for an increased charge in the DRAM cells for a particular lithography size by allowing the storage capacitor to be held at a larger potential voltage difference. When a write is performed to the DRAM cell, the selector connects the appropriate bit lines, for example, /BL0 and BL0. The desired row write line is opened and the bit line sense amplifier is driven to a high voltage state for the desired bit line and the corresponding complementary bit line is driven to a low voltage state. This enables the storage capacitor to contain a larger potential voltage difference. The voltage difference Vcell may be VDD rather than VDD/2 as the first bit line, BL0, is charged to VDD and the complementary bit line is drained to a low voltage state (ex.: ground). Read operations may be performed as before by precharging the bit lines, selecting the desired word line and sensing the voltage difference.

The complementary bit line /BL of FIG. 4 has less capacitive loading than it may appear. This is because the other side of the DRAM cell capacitors are not AC grounded, but rather are floated. When looking into a cell from the opposite side, that is, from the cell plate node, the capacitance can be seen as the capacitance of the cell (Ccell) in series with source-to-gate capacitance (Csg)+source-to-body capacitance (Csb). Assuming Cdg=Csg and Csb=Cdb, then capacitance loading is equal to Ccell in series with (Cdg+Cdb), and can be expressed as Ccell*(Cgd+Cdb)/(Ccell+Cgd+Cdb), and thus equal to (Cgd+Cdb)/[1+(Cgd+Cdb)/Ccell]. For conventional DRAM cells as shown in FIG. 1, when looked at from an access transistor's drain, the capacitance can be seen as equal to the drain-to-gate capacitance (Cdg)+drain-to-body capacitance (Cdb). However, this capacitance load is larger than (Cgd+Cdb)/[1+(Cgd+Cdb)/Ccell] and the complementary bit line /BL of FIG. 4 has a smaller capacitive loading than a conventional bit line BL of FIG. 1.

Figure 7A:
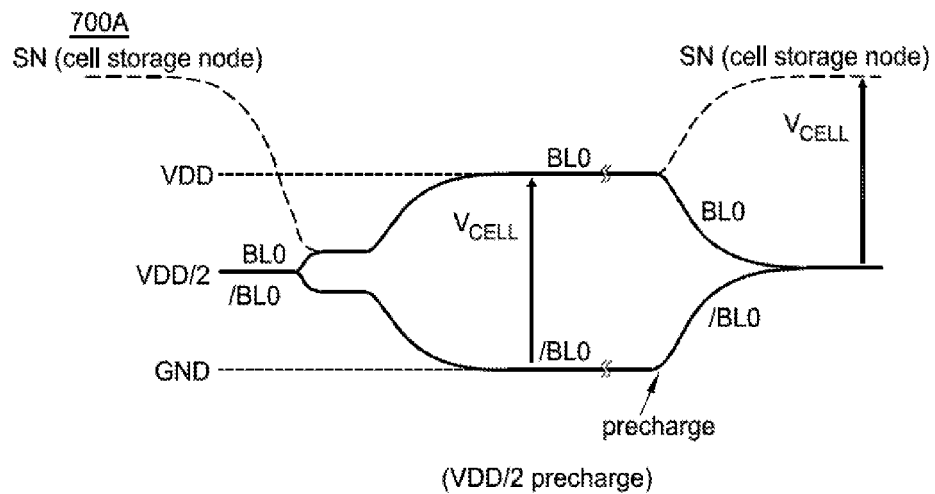
FIG. 7A shows a voltage diagram of VDD/2 precharge, in accordance with certain aspects of the present disclosure.

FIG. 7A shows a voltage diagram 700A of VDD/2 precharge, in accordance with certain aspects of the present disclosure. The charge in the storage node SN may be boosted by precharging. For example, during a write operation, the bit line BL0 and complementary bit line /BL0 may be precharged to VDD/2. The desired write line is opened, and the storage capacitor may charge or discharge to the bit line. The desired column is then forced to the high or low voltage state based on the value to be written. For example, here BL0 may be forced to VDD and complementary bit line /BL0 to ground. In such a case, Vcell is VDD. The voltage at the SN may then be boosted by Vcell above the precharged VDD/2 level, when the storage capacitor is then charged to store the appropriate value. Where the value indicates that the storage capacitor is to be discharged, no boost is applied and the storage transistor is discharged.

Figure 7B:
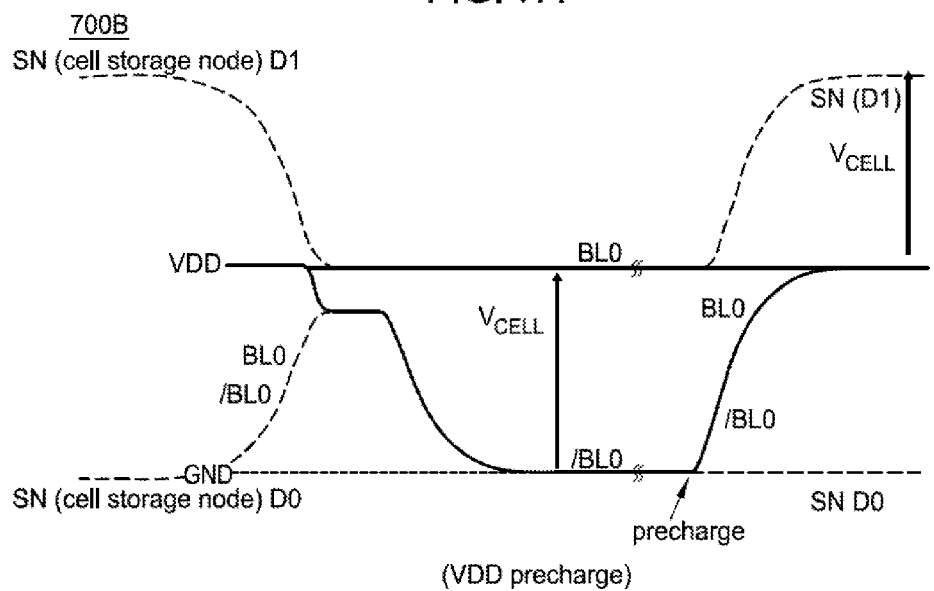
FIG. 7B shows a voltage diagram of VDD precharge, in accordance with certain aspects of the present disclosure.

FIG. 7B shows a voltage diagram 700B of VDD precharge, in accordance with certain aspects of the present disclosure. The charge in SN may be further boosted by precharging the bit lines to VDD. For example, during a write operation, the bit line BL0 and complementary bit line /BL0 may be precharged to VDD. The desired write line is opened, and the storage capacitor may charge or discharge to the bit line. For example, where SN D0 is discharged, connecting the respective bit lines transfers charge from the bit line to the storage capacitor, reducing the voltage of the bit line. Where SN D1 is charged to VDD, connecting the respective bit line does not change the voltages of the bit lines. The desired column is then forced to the high or low voltage state based on the value to be written. For example, here BL0 may be forced to VDD and complementary bit line /BL0 to ground. In such a case, Vcell is VDD. The voltage at the SN may then be boosted by Vcell above VDD, when the storage capacitor is then charged to store the appropriate value. Where the value indicates that the storage capacitor is to be discharged, no boost is applied and the storage transistor is discharged.

Figure 8:
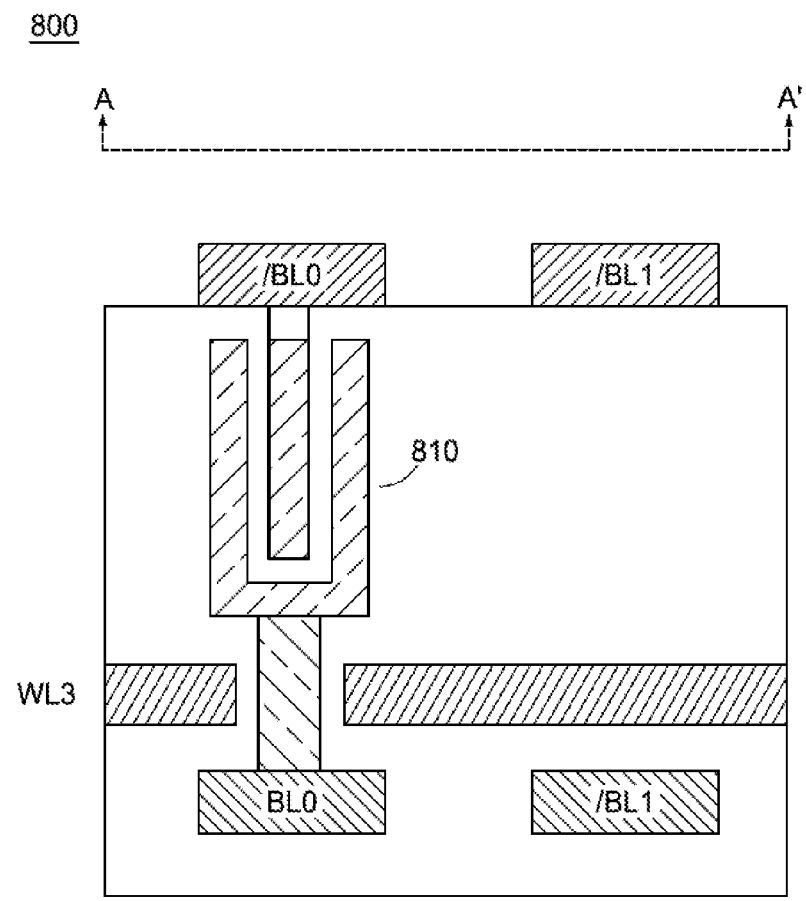
FIG. 8 is a cross section view of DRAM with pseudo differential sensing, in accordance with certain aspects of the present disclosure.

FIG. 8 is a cross section view 800 of DRAM 400 with pseudo differential sensing, in accordance with certain aspects of the present disclosure. As shown, the cross sectional view 800 corresponds to a slice from DRAM 400 from A to A' showing write line WL3, bit lines BL0 and BL1, complementary bit lines /BL0 and /BL1, and the storage capacitor 810.

Figure 9:
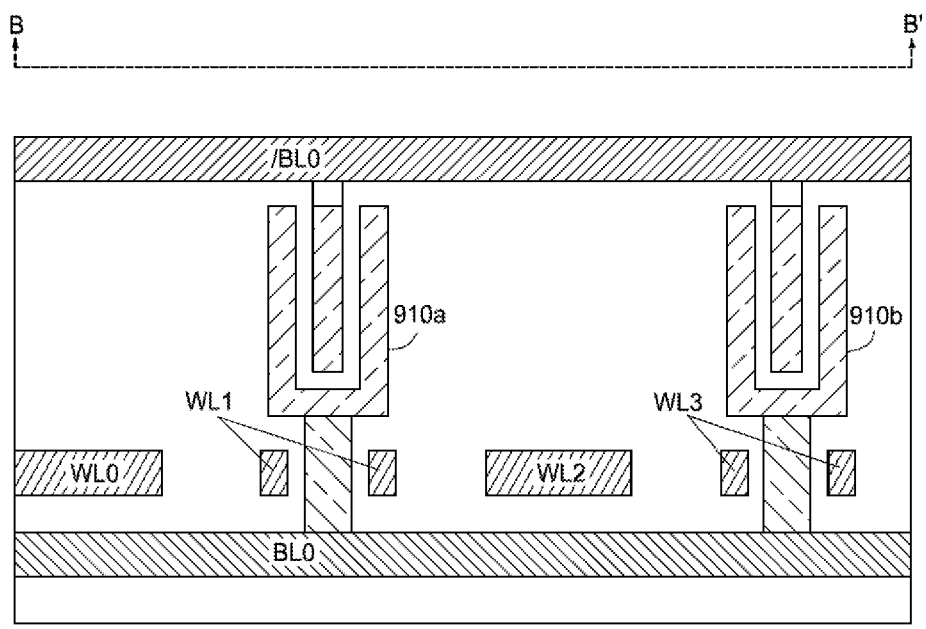
FIG. 9 is a cross section view of DRAM with pseudo differential sensing, in accordance with certain aspects of the present disclosure.

FIG. 9 is a cross section view 900 of DRAM 400 with pseudo differential sensing, in accordance with certain aspects of the present disclosure. As shown, the cross sectional view 900 corresponds to a slice from DRAM 400 from B to B'. Capacitors 910a and 910b are shown coupled to the bit line BL0 and complementary bit line /BL0. Write lines WL 1 and WL3 are coupled to capacitors 910a and 910b, respectively, via, for example, vertical surround gate transistors.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., the IDE tool and debugger) or related data available in the cloud. For example, the IDE tool and debugger could execute on a computing system in the cloud and track counts of tuples being output by processing elements in the streams processing environment. In such a case, the debugger could break at instances where a processing element outputs an unexpected amount of tuples to a destination processing element and store a log of such instances at a storage location in the cloud. Doing so allows a developer to access this information from any computing system attached to a network connected to the cloud (e.g., the Internet).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A dynamic random access memory (DRAM) device, comprising:
    an array of DRAM cells comprising:
        a first bit line, a second bit line, and a first complementary bit line;
        a first storage capacitor coupled between the first bit line and the first complimentary bit line;
        a second storage capacitor coupled between the second bit line and the first complimentary bit line;
        a first transistor selectable by a first word line to couple the first storage capacitor to the first bit line, wherein a voltage potential across the first bit line and the first complementary bit line when the transistor is selected is indicative of a bit of data;
        a second transistor selectable by a second word line to couple the second storage capacitor to the second bit line, wherein a voltage potential across the second bit line and the first complementary bit line when the second transistor is selected is indicative of a bit of data; and a bit line sense amplifier configured to selectively sense the voltage potential across i) the first bit line and the first complimentary bit line and ii) the second bit line and the first complementary bit line of a selected DRAM cell during a read operation wherein the first storage capacitor and the second storage capacitor share a node that is in series with the bit line sense amplifier and have a respective end directly coupled to the first complimentary bit line.

2. The DRAM device of claim 1, wherein the bit of data is written to a DRAM cell by applying a voltage potential across one of i) the first bit line and the first complimentary bit line and ii) the second bit line and the first complementary bit line during a write operation.

3. The DRAM device of claim 1, wherein the bit of data is read from a DRAM cell by sensing the voltage potential one of i) the first bit line and the first complimentary bit line and ii) the second bit line and the first complementary bit line during a read operation.

4. A dynamic random access memory (DRAM) device, comprising:

an array of DRAM cells comprising: a first bit line and a second bit line each comprising i) a capacitor comprising a first node coupled with a first complementary bit line and an end directly coupled to the first complementary bit line, and ii) a transistor selectable by a word line to couple a second node of each respective bit line to the storage capacitor of each respective bit line, wherein a voltage potential across one of the i) first bit line and the first complimentary bit line and ii) the second bit line and the first complementary bit line, when the transistor is selected, is indicative of a bit of data;

a sense amplifier configured, via a switch, to selectively sense the voltage potential across one of i) the first bit line and the first complimentary bit line and ii) the second bit line and the first complementary bit line of a DRAM cell during a read operation, wherein each capacitor shares at least one node in series with the sense amplifier.

5. The DRAM device of claim 4, wherein the bit of data is written to a DRAM cell by applying a voltage potential across one of i) the first bit line and the first complimentary bit line and ii) the second bit line and the first complementary bit line during a write operation.

6. The DRAM device of claim 4, wherein the bit of data is read from a DRAM cell by sensing the voltage potential across one of i) the first bit line and the first complimentary bit line and ii) the second bit line and the first complementary bit line during a read operation.

* * * * *